(12) United States Patent
Garland et al.

(10) Patent No.: US 7,626,375 B2
(45) Date of Patent: Dec. 1, 2009

(54) SYSTEM AND METHOD FOR CONFIGURING A DISPLAY FOR A DIGITAL MULTIMETER

(75) Inventors: Anthony C. Garland, Camano Island, WA (US); Joseph Victor Ferrante, Redmond, WA (US); Brian Michael Capoccia, Seattle, WA (US); Lindsey Berdan, Seattle, WA (US); Bradey David Honsinger, Everett, WA (US); Jeffrey William Meyer, Seattle, WA (US)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 11/838,881

(22) Filed: Aug. 14, 2007

(65) Prior Publication Data

US 2009/0045800 A1 Feb. 19, 2009

(51) Int. Cl.
*G01R 1/38* (2006.01)
*G01R 11/57* (2006.01)
*G01R 15/00* (2006.01)
*G01R 15/08* (2006.01)
*G01R 7/00* (2006.01)

(52) U.S. Cl. ....................... 324/115; 324/141
(58) Field of Classification Search ........................ None
See application file for complete search history.

(56) References Cited

U.S. PATENT DOCUMENTS 5,218,290 A * 6/1993 Beckert et al. .............. 324/115

FOREIGN PATENT DOCUMENTS

EP  0 504 514 A  9/1992
JP  2001 311747 A  11/2001

OTHER PUBLICATIONS

EP Search Report; European Application No. 08162447.0-1524; Applicant: Fluke Corporation; Mailed Nov. 19, 2008; 24 pages.

\* cited by examiner

*Primary Examiner*—Ha Tran T Nguyen
*Assistant Examiner*—Roberto Velez
(74) *Attorney, Agent, or Firm*—Perkins Coie LLP

(57) ABSTRACT

A digital multimeter with a rotary switch having a plurality of positions, each of the positions corresponding to a primary measurement function to be performed. An LCD displays secondary functions or modes corresponding to the positions of the rotary switch and values determined by performing one of the measurement functions. The multimeter includes default functions for each position of the rotary switch that may be changed to other functions or modes. When the other functions or modes are set in a first position, the rotary switch is moved to a second position, and returned to the first position the multimeter restores the functions and/or modes set when the rotary switch was previously in the first position.

9 Claims, 11 Drawing Sheets

SYSTEM AND METHOD FOR CONFIGURING A DISPLAY FOR A DIGITAL MULTIMETER

BACKGROUND

Multimeters are used for measuring a variety of parameters associated with electrical circuitry, such as currents, voltages, resistance and capacitance. A multimeter can be a handheld device useful for basic fault finding and field service work or a sophisticated bench instrument that can measure with a very high degree of accuracy. The instrument may be implemented with an analog meter deflected by an electromagnet or with a digital display such as an LCD (liquid crystal display) screen. While older analog multimeters might have basic accuracies of 5-10%, modern portable digital multimeters, or DMMs, may have accuracies up to ±0.025%.

Multimeters commonly include rotary switches configured such that each rotated position of the rotary switch indicates a different measuring function. For example, a rotary switch on a conventional multimeter may be configured such that a first position corresponds to a voltage measurement, a second position corresponds to a current measurement, and a third position corresponds to a resistance measurement. In this manner, a single instrument can act as a voltmeter, an ammeter, or an ohmmeter by simply rotating a switch.

Since modern digital multimeters provide far more functionality than just three measurement types, rotary switch interfaces have been devised such that a single rotary switch position can be toggled between several measuring functions. As examples, a single position of a rotary switch may correspond to different units of measurement, such as Amps ("A") or milliamps ("mA"), or even different measurement types altogether, such as a current measurement or a temperature measurement. Typically, the multimeter provides capability on the switch itself or on a function key to toggle between the different measurement functions within the single rotary switch position.

Another feature found in modern digital multimeters enables a user to select between different modes that affect what or how measurements are acquired, maintained or displayed. For example, a user can select a "Minimum/Maximum" mode, which updates the display with the highest and lowest detected measurement values. As another example, a user can select to "Record" a measurement value for memory storage and later retrieval.

Accordingly, digital multimeters incorporate various tools for performing different types of measurements and different capabilities for displaying measurement values in a digital format on a screen. Further capabilities and improvements are needed, however, in both hardware and software, to enable users to organize measurement information to be obtained by the instrument so as to operate the instrument efficiently, effectively, and safely.

DETAILED DESCRIPTION

An inventive digital multimeter instrument and inventive methods for operating a digital multimeter are disclosed below in detail. In particular, the digital multimeter as described herein incorporates a rotary switch, a series of keys and buttons, and a digital display so as to provide highly integrated, programmable and configurable features not available on conventional multimeters. Several of these features, either taken alone or in combination, provide significant improvements in ease of use, speed of user operation, and safety associated with use of the instrument. The modifications, alterations, and additions to conventional multimeters that were necessary to accomplish these features resulted in benefits that otherwise would not have been foreseen or appreciated by others skilled in the art.

Description of Components in a Highly-Integrated Multimeter Instrument

Figure 1:
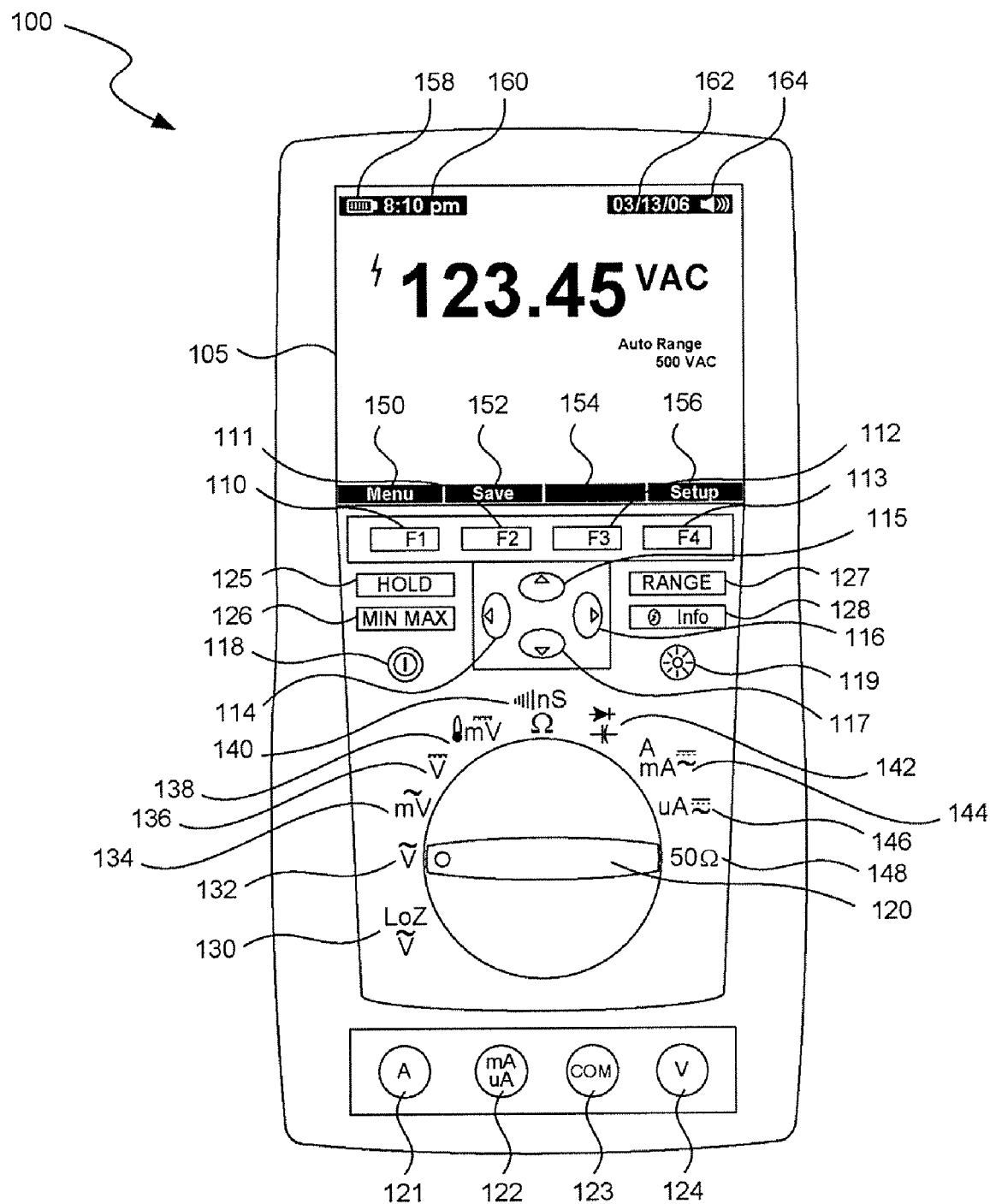
FIG. 1 illustrates a front face of a digital multimeter integrating a rotary switch, various soft keys and buttons and an LED screen to provide highly-configurable multimeter operation in accordance with an exemplary embodiment.

A face for an exemplary multimeter 100 is illustrated in FIG. 1. In the exemplary embodiment, the multimeter can be housed with a compact, handheld body, including contour indentations so as to improve suitability for one-handed operation. The face of multimeter 100 is generally characterized by a display area 105, a rotary switch 120, soft keys 110-113, navigation buttons 114-117, dedicated buttons 125-128, and various input jacks 121-124. Multimeter 100 can be powered by four AA alkaline batteries (not shown) and as described below in greater detail.

Measurement Functions and Modes

Multimeter 100 may be used to provide a primary measurement function, such as voltage, current, temperature, resistance, continuity, conductance, capacitance, diode test, low impedance, low resistance (50 Ohms), and AC/DC combinations ("AC+DC", "AC,DC"). Primary measurement functions are mutually exclusive to one another, such that no two primary functions can be measured simultaneously. However, secondary measurement functions associated with a circuit signal being measured, such as frequency, duty cycle, pulse width, decibels, and crest factor, can be provided at the same time as a primary function to convey additional measurement information for user display.

Meter 100 in accordance with an exemplary embodiment may be set to display certain "modes" that operate in conjunction with a measurement function. These "modes" determine how measurements are acquired and represented without changing the measurement function. "Min/Max," "Hold," "Range," "Peak," and "Record" are examples of modes that can operate in conjunction with the measurement function. "Min/Max" is a mode in which the multimeter displays the live minimum, maximum, and average measurements that have occurred from the time the initial measurement of a parameter began. In other words, whenever a new maximum or minimum occurs—exceeding the previous maximum or minimum—the new value is stored. "Hold" is a mode in which a displayed value is frozen on the display. "Range" is a mode in which the range, or resolution, of the displayed value is specified by user input. "Recording" is the automatic saving of a sequence of measurements of a single parameter over a period of time for future review or storage. As examples, a resistance measurement can be recorded (using the "record" mode).

User Input Devices—Rotary Switch, Buttons, and Keys

As will now be described, multimeter 100 in accordance with an exemplary embodiment can include a rotary switch 120, a set of navigation buttons 114-117, a set of soft keys 110-113, an on/off switch 118, a backlight control button 119, and an [Info] button 128. Additionally, multimeter 100 can include dedicated mode buttons including [HOLD] 125, [MIN MAX] 126, and [RANGE] 127 buttons. A user can configure the device as desired by utilizing multi-function buttons or dedicated buttons or "soft key" buttons corresponding to display 105. Output can be presented to the user with the display 105, an indicator light, and/or an audible beeper. Multimeter 100 can include an internal memory for storing information, such as measurement values.

Soft keys 110-113 can be located in an area beneath the display 105 and positioned to correspond with labels 106-109 on the display. Pressing one of the soft keys 110-113 invokes the command indicated by the corresponding label on the display. Every screen has a custom set of soft key labels 106-109. Some screens have fewer labels than soft keys. When a soft key does not have a corresponding label, that soft key is disabled. For example, in the screen shown in FIG. 1, "Menu" 150 corresponds with soft key 110, "Save" 152 corresponds with soft key 111, "Setup" 154 corresponds with soft key 113, and soft key 112 does not have a corresponding label.

Navigation buttons 114-117 can be centrally located among the other buttons of multimeter 100. Navigation buttons 114-117 correspond to four cardinal directions: [UP] 115, [DOWN] 117, [LEFT] 114, and [RIGHT] 116. Navigation buttons 114-117 are used to move within menus and dialogs and to make choices and perform data entry. They can also be used to scroll through a sequence of information too extensive to be displayed on a single screen.

[Info] button 128 can provide access to context-sensitive information about the measurement function and display contents. Further details regarding [Info] button 128 are discussed below. The context-sensitive information may appear as a pop-up informational area which overlays most of the underlying screen.

Multimeter 100 can include a backlight for the display 105 to allow improved viewing in conditions of reduced light. The backlight is activated by backlight control button 119. Multimeter 100 can also include an On/Off button 118 used to turn multimeter 100 on or off.

In accordance with an exemplary embodiment, each position of rotary switch 120 corresponds to at least one different primary function. Rotary switch 120 includes positions 130, 132, 134, 136, 138, 140, 142, 144, 146, and 148. The functions are indicated by symbols surrounding rotary switch 120.

Rotary switch 120 can include functions such as: AC voltage measurement from 0 V to 1000.0 V, AC millivolt measurement from 0 mV to 3000.0 mV, DC voltage measurement from 0 V to 1000.0 V, DC millivolt measurement from 0 mV to 3000.0 mV, resistance measurement from 0Ω to 500.0 MΩ, capacitance measurement from 0.001 nF to 50 mF, temperature measurement, AC current measurements from 0 mA to 20.000 A, AC current measurements from 0 μA to 5000.0 μA, DC current measurements from 0 mA to 20.000 A, DC current measurements from 0 μA to 5000.0 μA.

In addition to a primary function, each position of rotary switch 120 can correspond to a specific screen displaying pertinent information to the function in use. As shown in FIG. 1, some positions of rotary switch 120 may include more than one symbol, in which case the symbol closest to rotary switch 120 is the default measuring function. Where only one symbol corresponds to a position, that symbol denotes the default measuring function. A menu item in rotary switch positions can provide one or more virtual buttons corresponding to soft keys 110-113 to allow the user to select between primary functions available within the rotary switch position, as will be discussed below with reference to FIGS. 4 and 5.

Dedicated mode buttons provide direct single-press access to measurement modes. [HOLD] button 125 can be used to hold the currently displayed measurement value. [MIN MAX] 126 button can be used to capture the highest, lowest, and average readings over time. [RANGE] button 127 can be used to manually select a measurement range. Other modes may be selected by using soft keys 110-113 and navigation buttons 115-117 to make selections from menus on display 105.

In the example shown in FIG. 1, rotary switch 120 can remain in its current position when multimeter 100 is turned off and back on using the separate [ON/OFF] button 118. This method of turning multimeter 100 on and off allows multimeter 100 to be turned off and back on without losing track of the presently active measurement function, including any selected secondary function or modes.

When rotary switch is turned from one function to another, a display for the new function appears on display 105. In some embodiments, button choices made in one function do not carry over into another function.

Analog connections on input jacks 121-124 can be used to provide input to be measured by multimeter 100. As shown in the example of FIG. 1, four input jacks 121-124 can be included along the bottom of multimeter 100 where the user connects input probes used to measure signals of interest. Output can be presented to the user with the display 105, an indicator light, and/or an audible beeper. Multimeter 100 can include an internal memory 204 for storing information, such as measurement values.

Multimeter User Display

As shown in FIG. 1, digital multimeter 100 includes a display 105, which may be an LCD screen or any other suitable type of display. In the illustrated embodiment, the rotary switch 120 in FIG. 1 is set to the V AC position, and so the display 105 exhibits a V AC primary measurement 134. As depicted in the figure, the measurement may be displayed in a bold type and/or in a comparatively larger font size in relation to other displayed measurements to indicate which measurement is the primary measurement. Display 105 may further exhibit a secondary measurement, which is a measurement on the display representing an additional function shown concurrently with the primary measurement.

Schematic Layout of Multimeter Circuitry and Components

Figure 2:
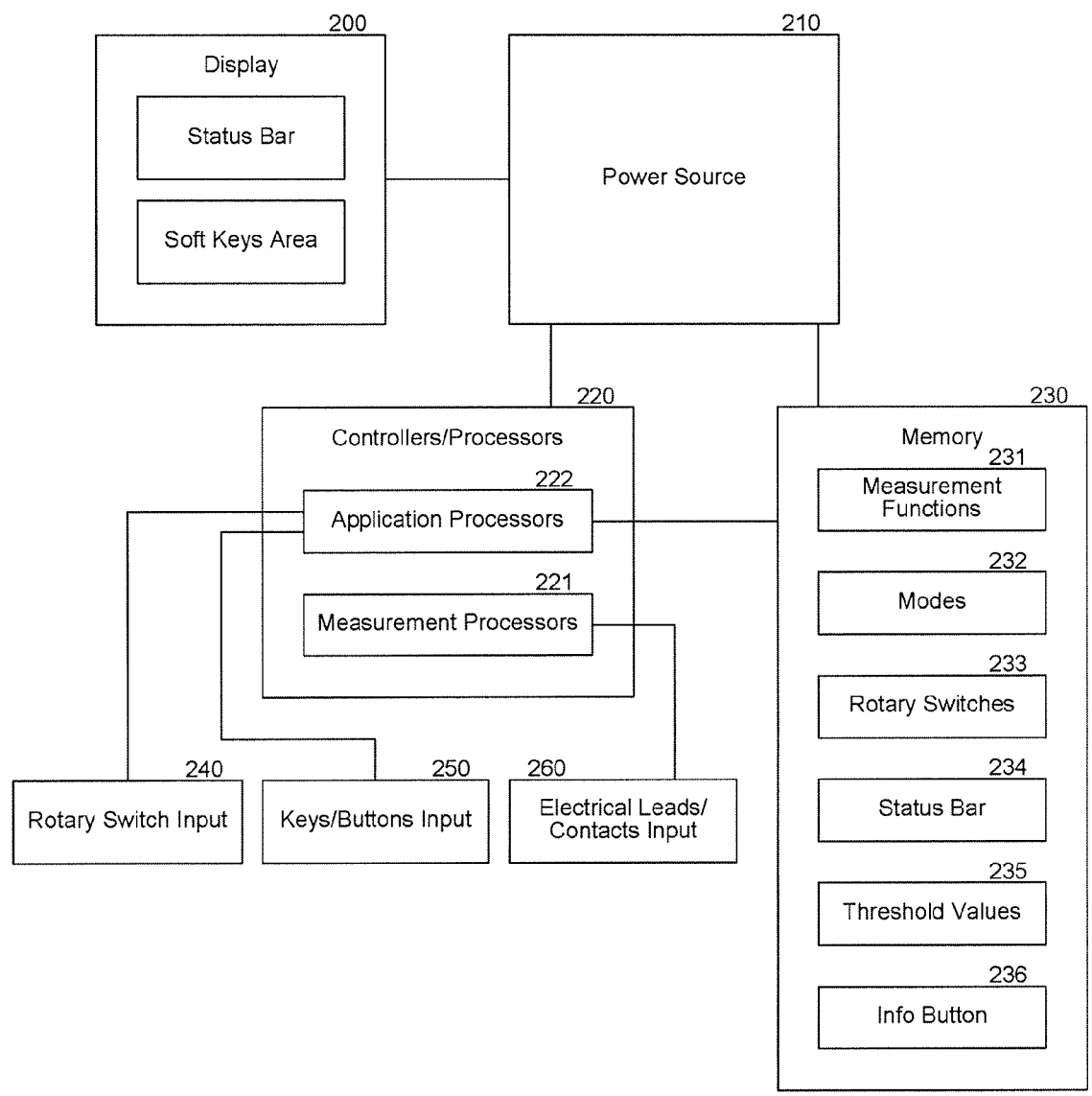
FIG. 2 is a schematic layout of the circuitry and components of which the digital multimeter of an exemplary embodiment is comprised.

FIG. 2 is a schematic layout of the circuitry and components of which the digital multimeter 100 of an exemplary embodiment is comprised. As shown, the multimeter includes a digital display 200, a power source 210, controllers and processors 220, a memory section 230, and three input types 240, 250, and 260.

As described above, the display 200 can be an LCD display, and is generally characterized as having a relatively small footprint of approximately 6-8 square inches. The display 200 includes an area for a status bar 201 near an upper portion, and an area for defining soft keys at a bottom portion, as will be described below. The display 200 is electrically connected to the controllers/processors 220 to receive data to output, and to power source 210 to receive electrical power.

As a portable system, power source 210 can be comprised of batteries, such as 4 AA alkaline batteries, or it can incorporate an AC adapter to receive power from a standard AC electrical outlet. The power source is connected to the display 200, the controllers/processors 220, and memory 230.

The controllers/processors include at least two processors in the exemplary embodiment. In particular, input from electrical leads 260 are provided to a measurement processor 221. This may be a processor presently available from Texas Instruments. The applications processor 222 receives input relating to measurement applications, including the rotary switch input 240, and the variety of keys and buttons 250 on the face of the multimeter. The applications processor 222 also retrieves data from various databases in memory 230 and provides output to display 200. The applications processor may be one presently available from Freescale, as an ARM processor.

Memory 230 can be any combination of RAM, ROM, DRAM, Flash, EPROMs, EEPROMs, or any other semiconductive memory chip. The memory may be comprised within one chip or may be distributed among a plurality of chips or databases. The memory 230 stores information relating to the various measurement functions 231 (e.g., V AC, V DC, ohms, etc.) and modes 232 (e.g., auto-save, relative) as both were described above, as well as information pertaining to rotary switch measurement/mode programming 233, status bar mini-measurement display 234, threshold values 235, and the Info button 236, as will each be described below in further detail.

Rotary Switch and Rotary Switch Memory

Figure 3:
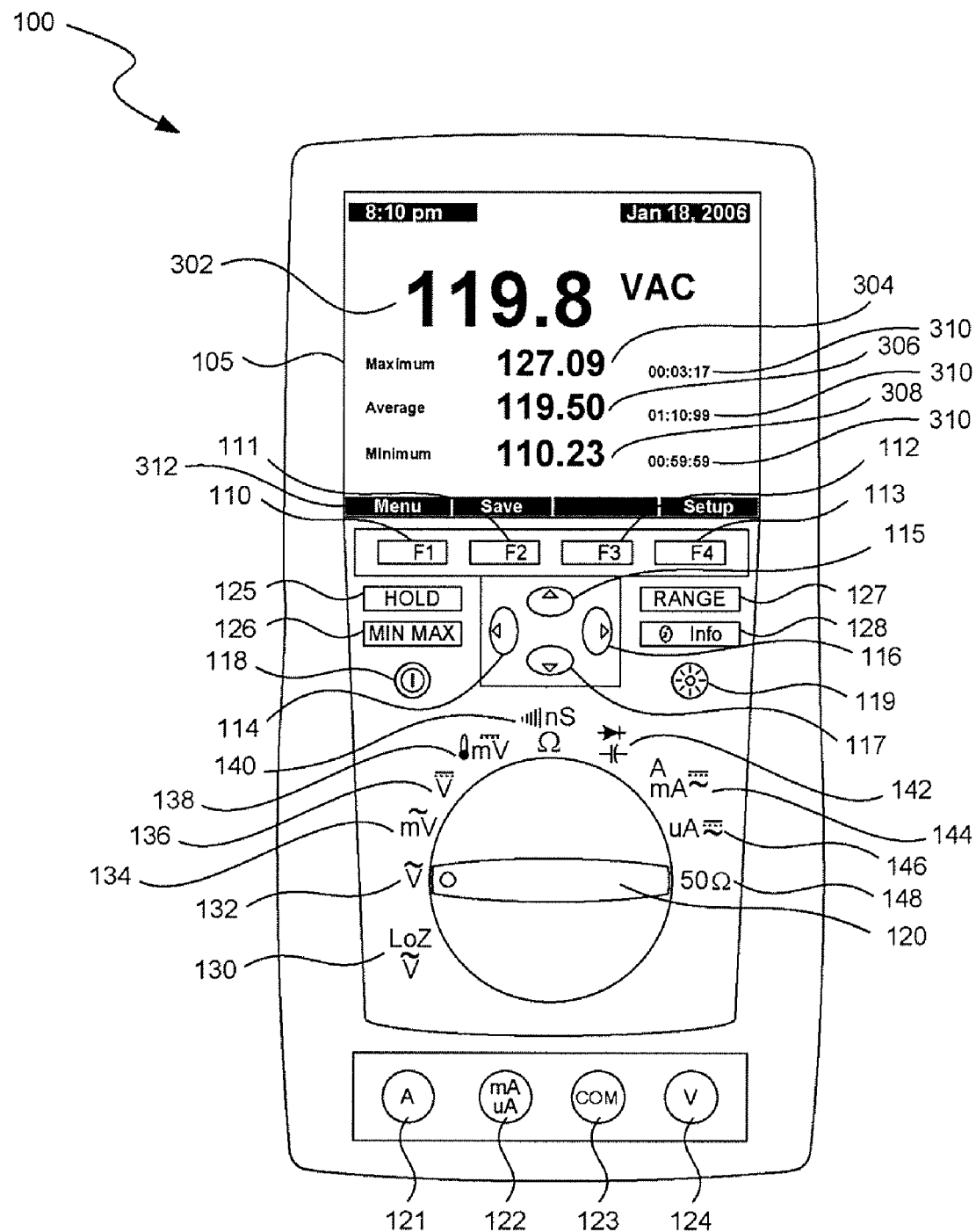
FIG. 3 illustrates a screen that can appear after Max/Min mode has been selected.

FIGS. 1-7 illustrate screens associated with repositioning rotary switch 120. FIG. 1 illustrates a screen in which Volts AC 132 has been selected by toggling rotary switch 120 to position 132. The screen displays the measured voltage "123.45 VAC" 102. FIG. 3 illustrates a screen that can appear after Max/Min mode has been selected by pressing [MIN MAX] button 126. The screen displays the measured voltage "123.45 VAC" 202, the maximum measurement value 304, the average measurement value 306, and the minimum measurement value 308. Each of the maximum, average, and minimum measurement values include an optional time stamp 310 denoting at which time the measurement values were detected.

Figure 4:
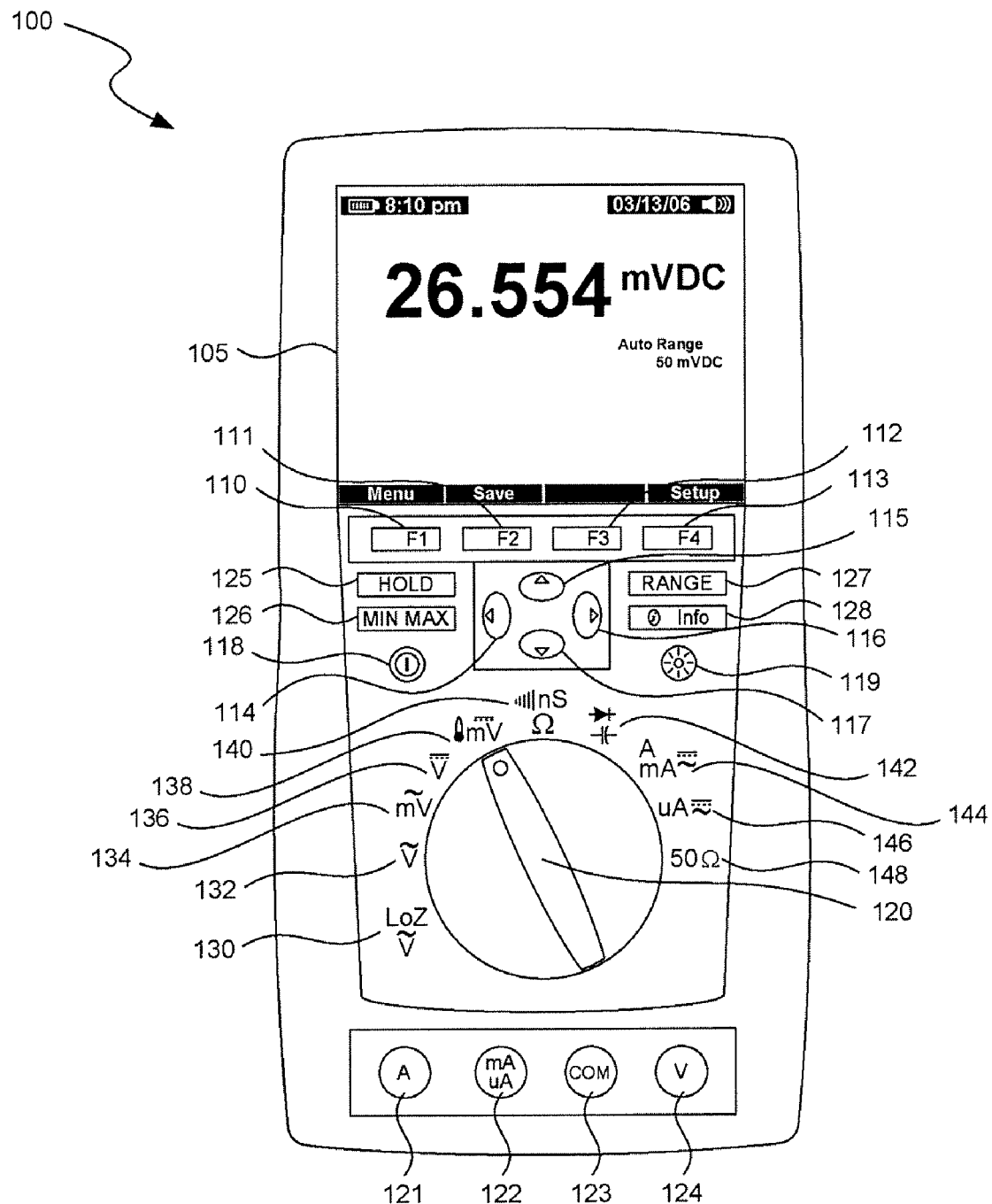
FIG. 4 illustrates a screen in which mVDC has been selected.
Figure 5:
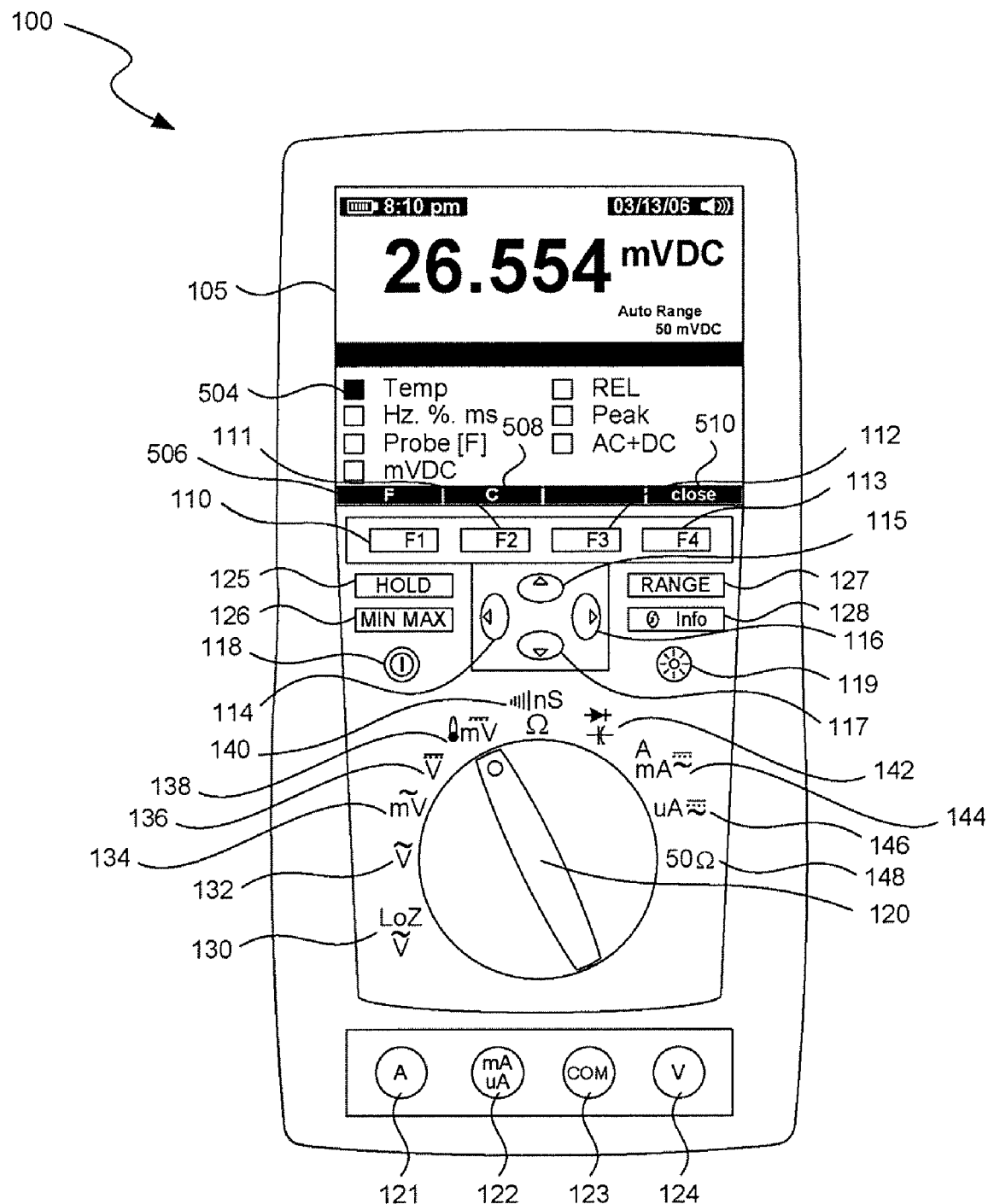
FIG. 5 illustrates an example of a function and mode menu.
Figure 6:
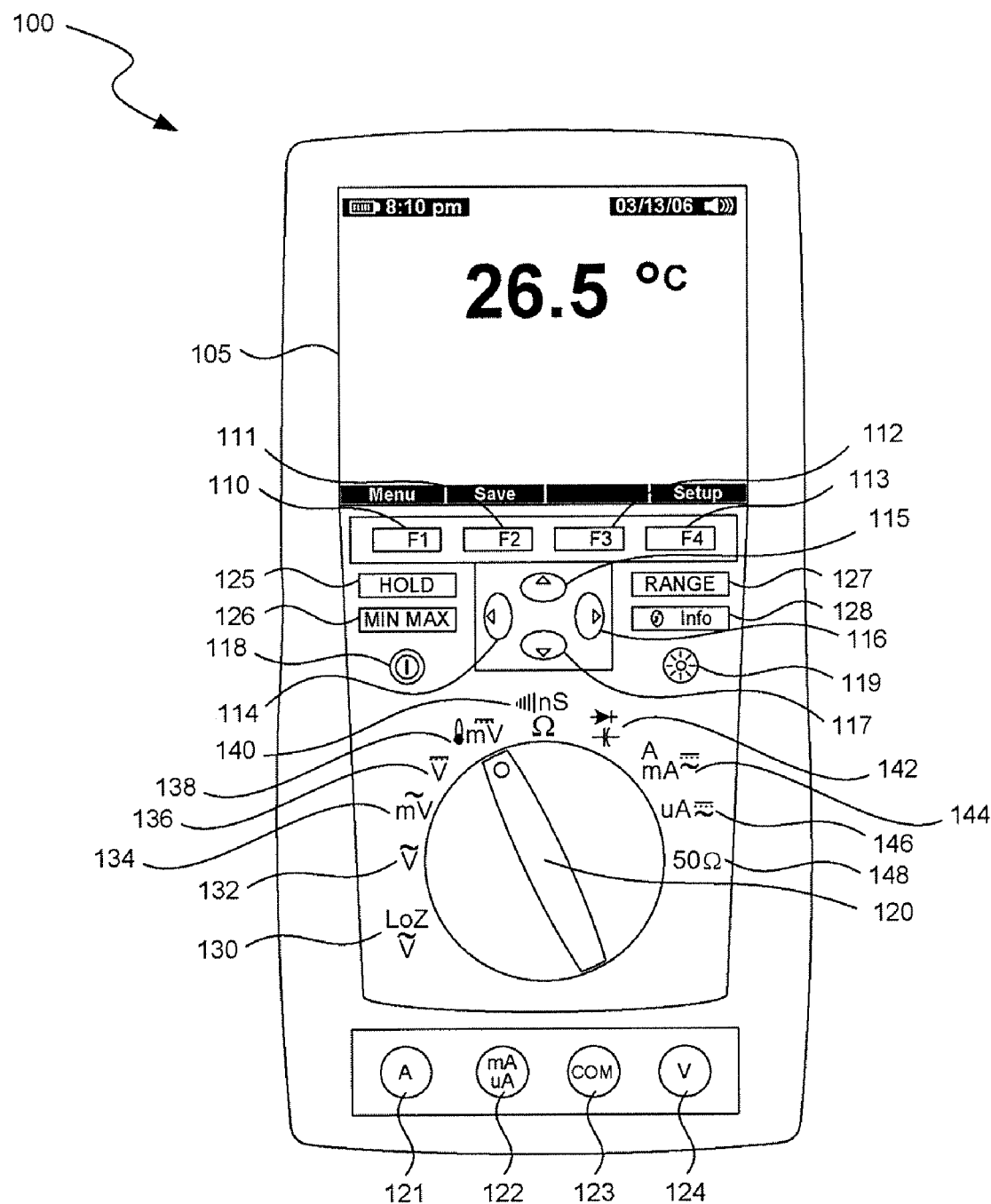
FIG. 6 illustrates a screen displaying a value for a measured temperature.
Figure 7:
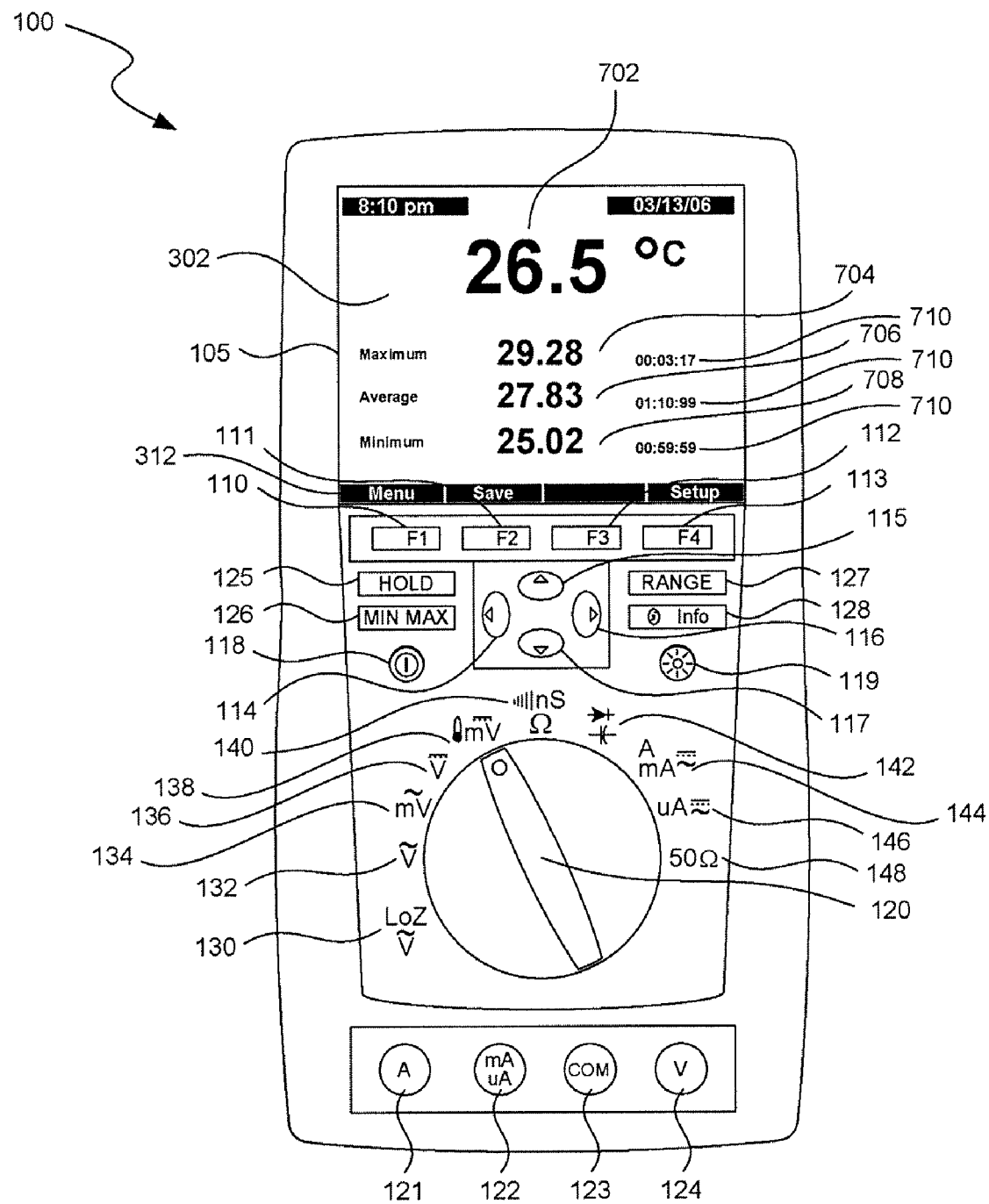
FIG. 7 illustrates a screen that can appear after a user selects Min/Max mode by pressing [MIN MAX] button while in the screen shown in FIG. 6.

FIG. 4 illustrates a screen in which mVDC, a default function, has been selected by toggling rotary switch 120 to position 138. To change the measuring function from mVDC to temperature, the user can press soft key 110, which corresponds with "Menu" 412. FIG. 5 illustrates an example of a function and mode menu that can appear after pressing soft key 110 in the screen shown in FIG. 4. The user can select temperature by using navigation keys 114-117 to highlight a box 504 located next to "Temp", as shown in FIG. 5. When "Temp" is selected, the functions corresponding to soft keys 110-113 can become "F" 506, "C" 508, and "close" 510, as shown in FIG. 5. By selecting "F" 606, the multimeter can measure temperature in degrees Fahrenheit. By selecting "C" 508, the multimeter can measure temperature in degrees Celsius. Selecting "close" 510 can close the menu and return the display to the screen shown in FIG. 4. FIG. 6 illustrates a screen that can be displayed after "C" 508 has been chosen in FIG. 5. FIG. 7 illustrates a screen that can appear after a user selects Min/Max mode by pressing [MIN MAX] button 126 while in the screen shown in FIG. 6. The screen displays the measured voltage "26.5° C." 702, the maximum measurement value 704, the average measurement value 706, and the minimum measurement value 708. Each of the maximum, average, and minimum measurement values include an optional time stamp 710 denoting how much time has elapsed when the measurement values were detected.

The multimeter can include rotary switch memory, which is a memory that stores functions and modes for individual rotary switch positions. Rotary switch memory (RSM) can be configurable in the setup screen in which it can be turned on or off. The setup screen appears when "setup" 156 is selected by pressing soft key 113 in FIGS. 1-3, 5, and 6. For example, when RSM is off and functions and/or modes are set in a first position of rotary switch 120 in FIG. 1, multimeter 100 restores default functions and modes once rotary switch 120 is moved to another position. With RSM disabled, multimeter 100 will not remember the settings once rotary switch 120 is returned to the first position. However, multimeter 100 can remember the settings when multimeter 100 is turned off if rotary switch 120 remains in the same position when multimeter 100 is turned back on. In other words, due to a non-volatile memory, multimeter 100 can continue to have the same settings when multimeter 100 is turned off or the batteries are taken out so long as rotary switch 120 does not change positions.

When RSM is on and functions and/or modes are set in a first position of rotary switch 120, multimeter 100 will remember the functions and/or modes for the first position. As a result, when rotary switch 120 is moved to a second position, and then returned to the first position, the functions and/or modes previously set in the first position will remain. A non-volatile memory can allow RSM settings to be remembered if the batteries are taken out of multimeter 100. In some instances, a user may only use a certain function and/or mode for a position of rotary switch 120 and not use the default settings. If the user sets the function and/or mode once, the settings will remain the same until RSM is turned off, the user changes the secondary function and/or mode, or the user resets defaults. The user can reset all positions to default functions with one command through a menu on display 105. Alternatively, individual positions can be reset to default functions without affecting the settings for other positions.

Returning to the example shown in FIGS. 1-7, if the RSM function is enabled, and rotary switch 120 is toggled back to position 132 while in the screen shown in FIG. 7, the multimeter will automatically return to the screen of FIG. 3. If the RSM function is disabled, and rotary switch 120 is toggled back to position 132 while in the screen shown in FIG. 7, the multimeter will automatically return to the screen of FIG. 1. If the RSM function is enabled, and rotary switch 120 is toggled back to position 132 while in the screen shown in FIG. 7, and then returned again to position 138, the multimeter will automatically return to the screen shown in FIG. 7. If the RSM function is disabled, and rotary switch 120 is toggled back to position 132 while in the screen shown in FIG. 7, and then returned again to position 138, the multimeter will automatically return to the screen shown in FIG. 4.

In some embodiments, certain modes may not ever be affected by RSM. For instance, to comply with safety standards, low-pass filter mode may not be remembered by multimeter 100. Low Pass Filter is a mode in which a filter passes low frequencies but reduces frequencies higher than a cutoff point. A potentially dangerous situation could be one in which a user forgets that the multimeter is in low-pass filter mode and mistakenly believes that the low-pass filter reading is the live reading. In this situation, the user may be injured by touching live connections that he believes to be safe. To prevent this situation, low-pass filter can be excluded from the modes affected by RSM, in which case the user will be forced to set multimeter 100 to low-pass filter mode every time this mode is desired. It is contemplated that a multimeter can allow the user to set which functions and modes may or may not be affected by RSM.

Procedures may include steps which require the user to rotate the switch 120 to a new function to perform a measurement. It is possible to switch measurement functions within the context of a procedure. When RSM is on, rotating the switch will not effectively reset the state of multimeter 100, which will prevent multimeter 100 from losing its place in the procedure. Even when multimeter 100 is turned off and back on, if a procedure was active at the time it was turned off, multimeter 100 can resume at the previous step within the procedure. If rotary switch 120 has changed position while multimeter 100 was off, the user can be prompted to move rotary switch 120 back to the correct position in the procedure in order to continue. The user can also elect to cancel the procedure which was in progress.

Since a user may only use particular settings that are different from the defaults, RSM can always be enabled in some embodiments so that these users do not inadvertently disable RSM and lose all of their settings. When RSM is always enabled, there will be no way to disable RSM. In these embodiments, the user may be required to manually change every setting or the user may be able to simply push a button to restore defaults. If the user restores a default for a position, RSM will remember the default every time the user returns to that position unless the user changes the settings.

Rather than RSM being constantly enabled for all positions of rotary switch 120, RSM can be permanently enabled for only certain positions of rotary switch 120. In these embodiments, the user can control whether RSM is enabled in the positions in which RSM is not permanently enabled.

Figure 8:
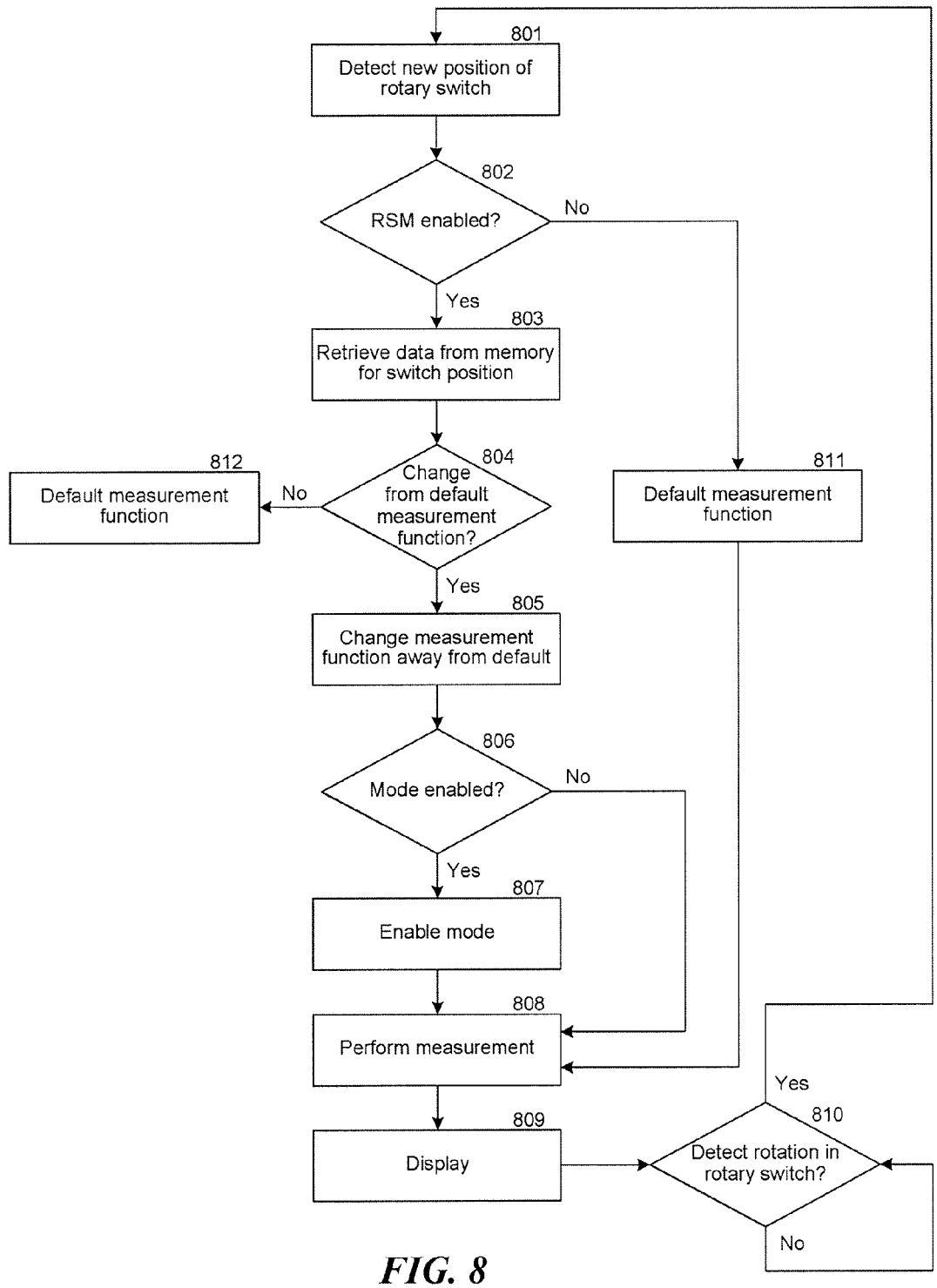
FIG. 8 illustrates a flow diagram for the procedure followed by the multimeter when the rotary switch is moved to a new position.

FIG. 8 illustrates a flow diagram for the procedure followed by the multimeter when the rotary switch is moved to a new position. In step 801, the application processor detects whether rotary switch has moved. In step 802, the application processor determines whether RSM has been enabled, which can be done using the setup menu, as referred to above. If RSM is disabled, in step 806 application processor will revert back to the default measurement function. Then, the application processor continues to steps 808 and 809 in which the multimeter performs the measurement and displays the measurement value. If the application processor detects that RSM has been enabled, in step 803 the processor will retrieve data stored by the memory corresponding to the current switch position. In step 804, the application processor will determine whether the function in the current switch position was previously changed to a function different from the default function. If the measurement function has previously been changed to a function different from the default function, in step 805 the processor will select the measurement function previously used. Then, the application processor will proceed to step 806.

If during step 804 the application processor determines that the default function was previously used in the switch position, in step 812 the processor will revert back to the default function. Then, the multimeter will continue to step 806, in which the multimeter determines whether a mode was enabled previously in the switch position. If a mode was enabled previously in the switch position, in step 807 the processor will enable the previous mode. Then, the application processor will continue to step 808 in which the processor performs the measurement function and step 809 in which the measurement value and prescribed mode will displayed. If during step 806, the application processor determines that no mode was previously enabled, in step 808 the processor will perform the measurement function and in step 809 the processor will display the measurement value. After completing step 809, the application processor will determine whether the rotary switch has been moved and will return to step 801.

Dynamically Generated Status Bar Providing Live Measurement Reading

Digital multimeters commonly are used to perform relatively simple measurements of voltage, current, resistivity or other circuitry parameters. When used for this purpose, the instrument typically displays the measured value in a prominent manner on a display screen to apprise a user of the measurement result.

As discussed above, more sophisticated digital multimeters include capabilities to display measurement information beyond simple measurement values, relating to one or more different measurement "modes." For selection of at least some of these modes, the resulting measurement value displayed on the instrument is no longer the actual value of the voltage, current, or resistivity across a node in a circuit. Instead, the displayed value corresponds to a different characteristic of the actual measurement associated with the selected mode.

As an example, when a multimeter is placed into the "relative" mode, the instrument is configured to display measurement-related information concerning how far above or below the actual live measurement is from some reference value. For instance, if this mode is selected and configured for a reference value of 200V AC, the display generates information concerning how far above or below the actual measurement is from 200V AC, instead of displaying the actual measurement itself. Therefore, continuing with this example, if the actual measurement is 205V AC, the display will indicate +5 V AC. As another example, the selection of a "low pass filter mode" provides a displayed value that is based upon a filtered value, which may be significantly different from the actual live value being measured.

As an unfortunate consequence of utilizing different modes when operating a multimeter instrument, a user may easily be lulled into a misperception that the multimeter display is reporting an actual live measurement reading. As an example, while the "relative" mode is selected, a user may mistakenly believe that the "+5V AC" reading reports an actual live measurement, instead of being a +5V AC deviation from a 200V AC reference voltage value. In some situations, such a misperception could prove to be hazardous to the operator of the instrument.

In an exemplary embodiment of a digital multimeter, an additional display value is provided as a live measurement value to ensure that a user can discern the live actual measurement. However, because a portable, handheld multimeter incorporates a very small digital screen, displaying this value could tend to overcrowd the display or otherwise confuse the user. There thus exists a tension between the advantages of displaying the live, actual measurement prominently for safety considerations, and arranging the display in a manner for easy use with a quick glance at the instrument.

In accordance with the exemplary embodiment, a digital multimeter includes a dynamically generated status bar area that provides, in a single, predictable area, dynamically selected information believed to be of significance to a user. As shown in FIG. 1, the status bar may often (or always) include, for example, a battery strength indicator 158, the time 160 and date 162, and some indication of the instrument setting (speaker set "on") 164. Additionally, when necessary, the status bar may include a display of the live, actual measurement reading, and an icon indicating whether such a reading might be considered dangerous, and to be handled with caution. To preserve space on the display screen, the status bar may be positioned at the top of the screen (as shown in FIG. 1), or optionally, at a side or bottom area of the screen. In some embodiments, the positioning of the status bar may be configurable by a user. Importantly, the overall font of the information displayed on the status bar can be significantly smaller than the font by which other information is displayed on the main area of the screen.

Figure 9:
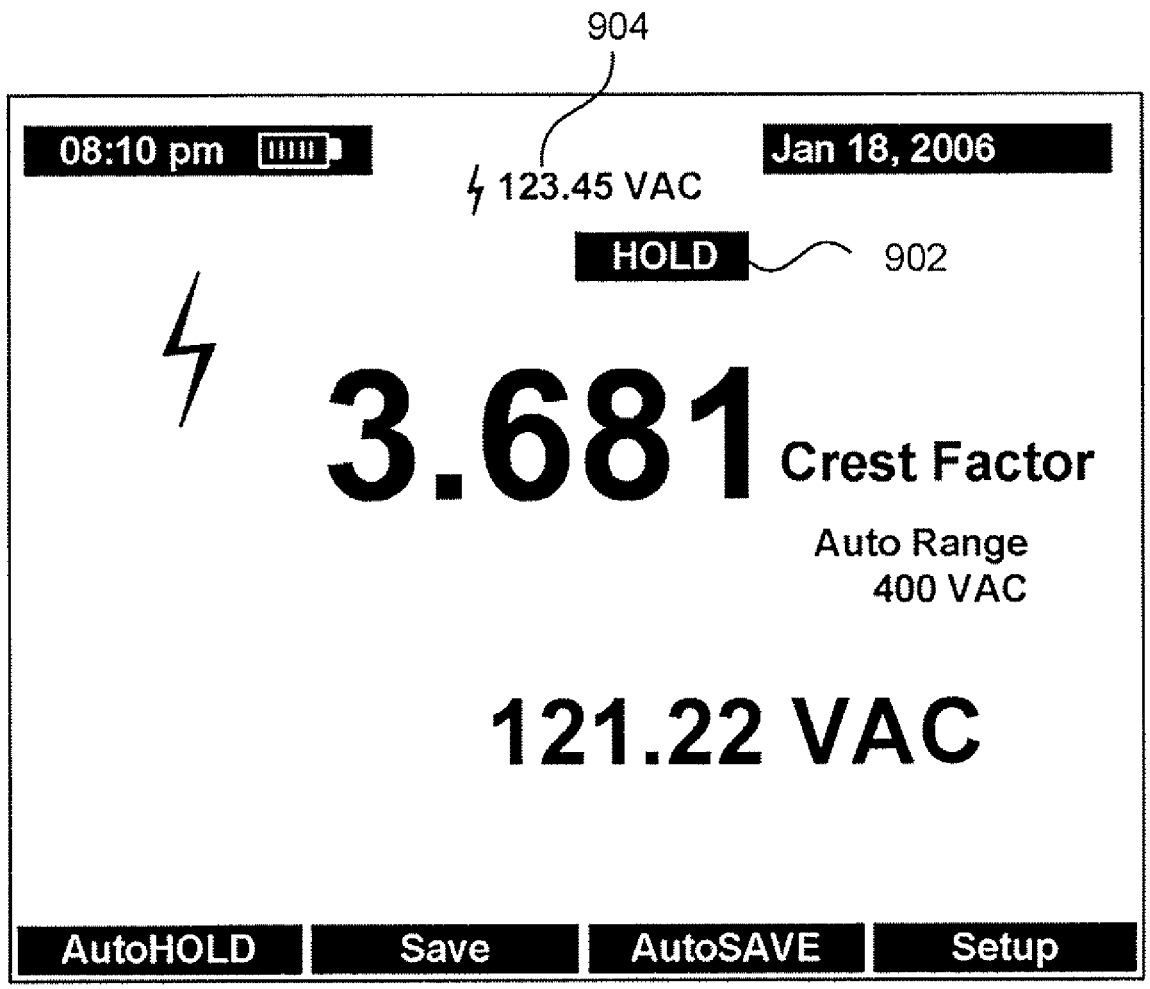
FIG. 9 illustrates a screen in which a "mini-measurement" informs the user of the live reading while display is frozen with a past reading on hold.

Accordingly, in some embodiments, a mini-measurement can be displayed automatically when the primary function's measurement is not displayed or is otherwise obscured from view on the screen. As yet another example, as shown in FIG. 9, a user may select a "hold" mode for freezing the display of a measurement, such that the main area of display 105 does not report the live, actual reading. As shown in FIG. 9, the status bar 902 includes an area 904 in which a "mini-measurement" informs the user of the live reading while display 105 is frozen with a past reading on hold. As shown in FIG. 9, the status bar displays the reading with the unit symbol or other indicia that would otherwise appear in the primary measurement. Additionally, when a secondary function is the primary measurement, the mini-measurement can display the primary function that the secondary function is derived from if the primary function is not displayed elsewhere on the screen. In some embodiments, the exemplary multimeter is configurable for setting a condition that prompts the mini-measurement to appear.

As an additional safety feature, the mini-measurement can be accompanied by a mini lightning bolt (mini bolt) if display 105 is displaying a Volts AC or DC function and a potentially hazardous voltage is present. This triggering value may be user-configurable, or it may be factory programmed. For instance, the mini bolt could be set to appear when the voltage reading is at or above 30 VAC. In some embodiments, the user can set the minimum voltage or other condition triggering the mini bolt to appear, and can alter a factory programmed value.

In some embodiments, primary readings may be accompanied by a comparatively larger lightning bolt (not shown) when a potentially hazardous voltage has been measured or multimeter 100 is being calibrated. If the mini bolt is displayed and a larger lightning bolt accompanying the displayed reading is obscured, the mini-measurement, the mini bolt, or both may blink. Additionally, the mini-measurement may blink when high current is present in the A and mA functions to warn the user that the fuse may eventually fail. In some embodiments, the user may be able to set a condition that prompts mini bolt to appear and/or to blink.

Figure 10:
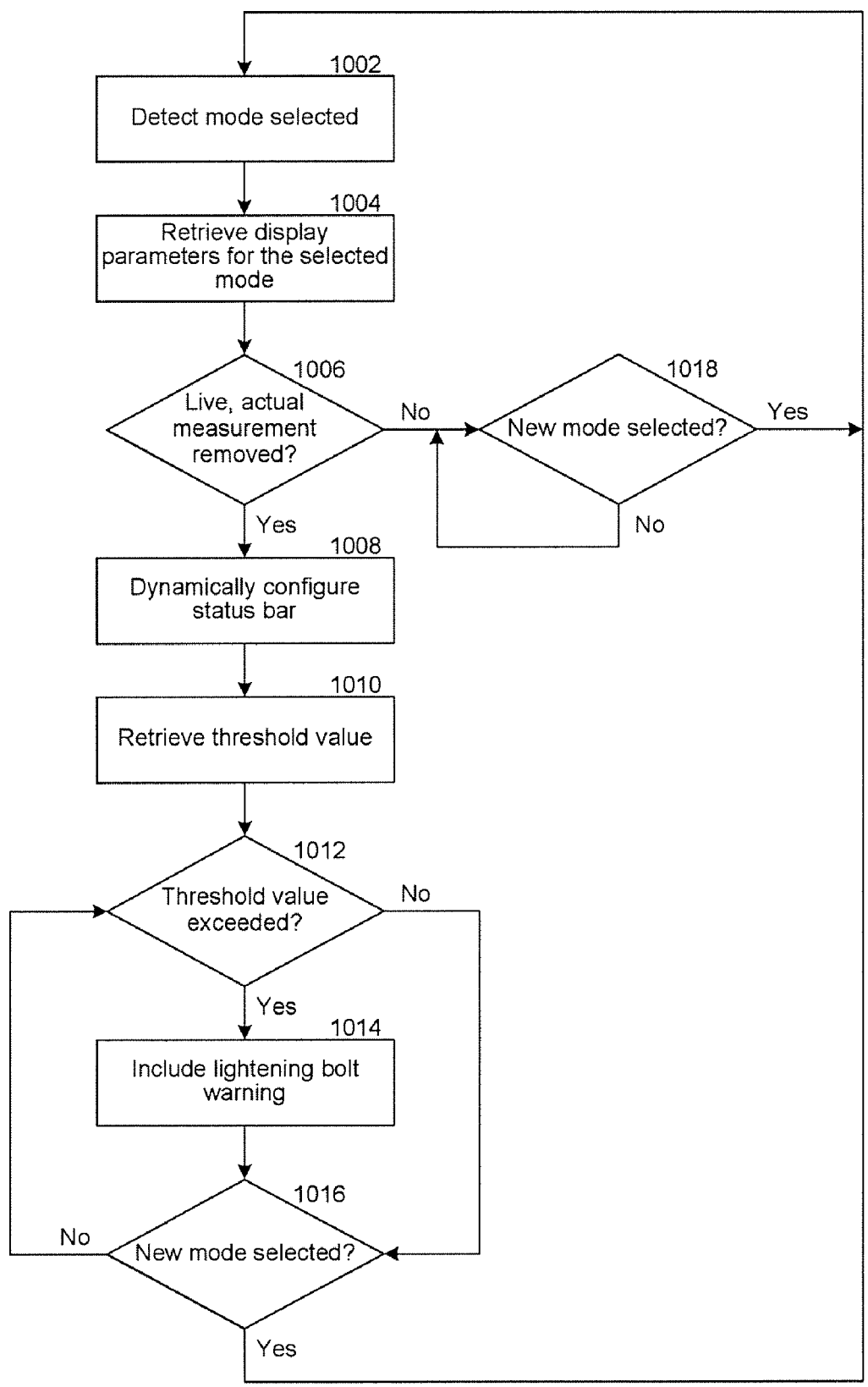
FIG. 10 illustrates a flow diagram for dynamically generating the status bar display in accordance with an exemplary embodiment.

FIG. 10 illustrates a flow diagram for dynamically generating the status bar display in accordance with an exemplary embodiment. In step 1002, the application processor detects that a mode was selected. In step 1004, the application processor retrieves display parameters from memory corresponding to the selected mode. Specifically, the "display parameters" detail whether the main display area continues to include the live, actual measurement. If, in step 1006, it is determined that the live actual measurement was removed, in step 1008 the status bar on the display is dynamically re-configured to include the live actual measurement with a reduced font size, as a "mini-measurement." If the live, actual measurement was not removed, then the system waits until a new mode has been selected.

In step 1010, the processor retrieves from memory a threshold value that was configured by the user or otherwise programmed into memory. If, in step 1012, the threshold value associated with the live actual measurement has been exceeded, in step 1014 a lightening bolt warning icon is included in the status bar area, and the system then determines whether a new mode was selected in step 1016.

Accordingly, the exemplary embodiment provides integrated capability to dramatically improve the safety associated with use of a digital multimeter with potential high voltage or high current circuitry. By dynamically re-configuring the status bar area display, the multimeter can include extra measurement data when needed, but remove this information from an already-crowded display area when the data otherwise would be redundant. Additionally, the exemplary embodiment includes a warning icon, such as a lightening bolt, to notify a user when the live actual measurement has exceeded a threshold value that could affect the safety of the user. By positioning this indicator in the status bar area, the user can quickly and efficiently check whether there are safety issues of concern, without otherwise disrupting the measurements in progress.

Information Screens

Operators using multimeters on work sites rarely carry an instruction manual for the instruments with them from location to location. However, as multimeter instruments have been increasingly complex and incorporate a wide variety of features, it is often helpful to have such a guide while taking measurements. Particularly, the operator may not remember what a certain icon represents, or in which application a function can be used. Referring to FIG. 1, in the exemplary embodiment, selecting [Info] button 128 provides the user an overview of all the operations and visual elements appearing in the display.

Although the example in the ensuing discussion provides for a dedicated button as a user input for requesting generation of an information screen, other forms of input may be used in place of a dedicated button.

In accordance with the exemplary embodiment, when [Info] button 128 is pressed, explanatory information providing an overview of the functionality of the icons and other information on the display can be displayed as a pop-up information dialog overlying most of the screen. The information displayed may vary according to the context at the time [Info] button 128 was pressed. For example, the [Info] button 128 may be pushed by a user to receive additional information concerning any of "Measure Volts DC," "Measure Volts AC," "Measuring Crest Factor," "Measuring Duty Cycle," "Recording Measurements," and "Choosing a Measurement Function." Since the context can vary with the position of the rotary switch and other possible soft key choices, the information displayed can vary according to these selections.

Each screen, menu, and dialog potentially can have a corresponding information dialog. When a menu is present on the screen, the selected item on the menu can determine the context for the informational dialog. Alternatively, all of the menu items can determine the context for the informational dialog.

Some topics may include instructions for using a function or examples of applications in which a user could employ certain functionality available on the instrument. For example, a topic could explain what a certain mode of measuring is and when one would use it. As additional functionality, the multimeter can be programmed by the user to include certain topics in certain contexts. For instance, a company may have a particular procedure for taking measurements in a building. The company could program the information dialog to show instructions for their procedure. This way, the operator only needs to carry the multimeter when performing the procedure.

The overview information can be programmed to eventually disappear after a set amount of time or after a certain event. Once the overview information disappears, the underlying information on the screen prior to the appearance of the dialog can be restored.

Figure 11:
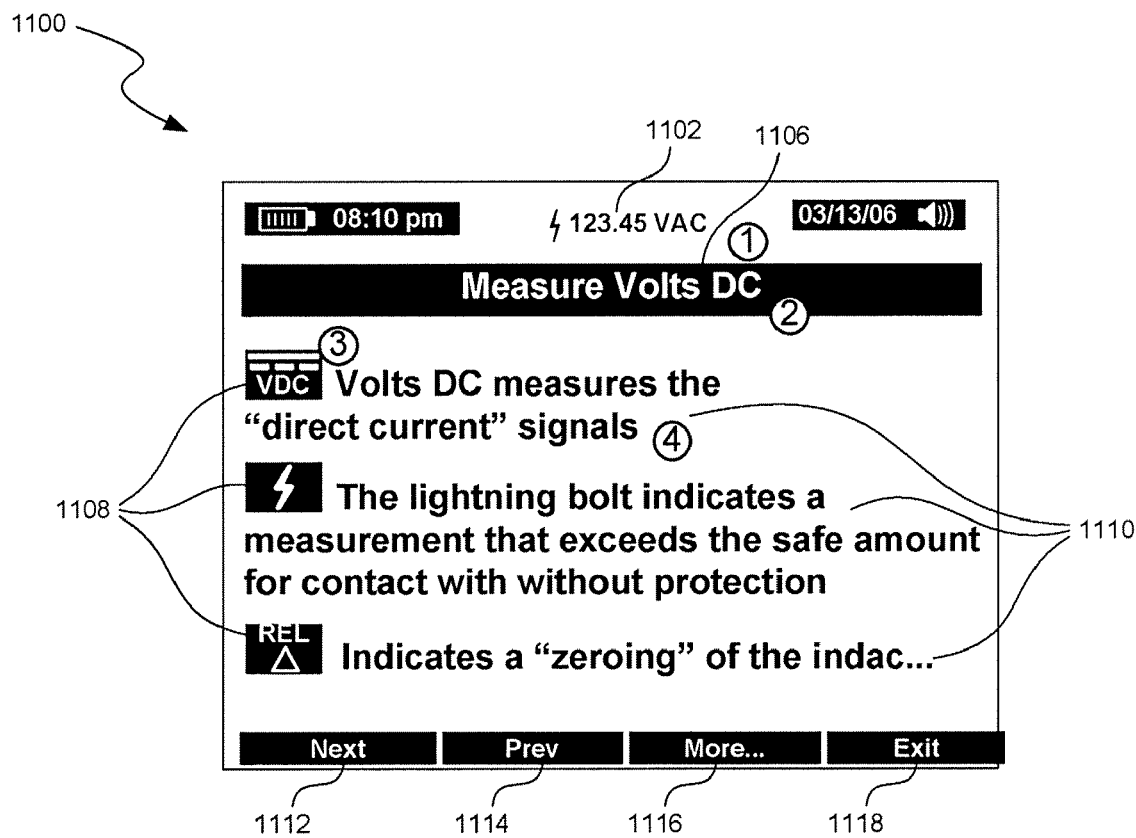
FIG. 11 illustrates an example of an information glossary configured for display on an LCD screen on a digital multimeter in accordance with an exemplary embodiment.

An example of a screen 1100 having an informational dialog that can be provided in response to a user pressing [Info] button 128 is shown in FIG. 1. Since overview information obscures the current measurement, a miniscale measurement 1104 can be provided. A title bar 1106 can indicate the context in which [Info] button 128 was pressed. In the example of FIG. 11, the context is measuring volts DC. A list of specific topics can be provided below the title bar 1106. Each topic can be related to the context in which [Info] button 128 was pressed. Each topic can be associated with an icon 1108 and a brief explanation 1110 of the subject. Icon 1108 provides an easy way for the user to quickly identify a topic. Additionally, icon 1108 can provide an anchor for each topic so that a user can switch from topic to topic using navigation buttons 114-117. The topics shown may be listed in order of relevance to the topic. When the user is uncertain about an operation or visible element appearing in the display, the user can push [Info] button 128 to learn about the operation or visible element appearing in the display.

The user can navigate forward and backward between individual topics as well as between pages. Soft Key 110 can be set to select "Next" 1112, which moves to the next topic entry for the screen. By pressing soft key 110 and looking at the icons, the user can move fairly rapidly to the topic of interest. Soft key 110 can be programmed to become disabled once the last topic is reached in the information dialog.

Soft key 111 can be programmed to select "Prev" 1114, which causes screen 1100 to move to the previous topic entry for the screen. Soft key 111 can be programmed to become disabled once the first topic is reached in the information dialog. Soft Key 112 can be programmed to operate to select "More . . . " 1116 which allows the user to scroll down the information one page at a time, ignoring topic boundaries. Selecting "More . . . " 1116 can provide a way for the user to continue reading the text accompanying an icon for a topic when only a portion of the text is shown on the display. Soft key 112 can be programmed to become disabled once the end of a topic is reached. The down navigation button can perform the same function as soft key 112 when the information dialog is present. The up navigation button can perform that opposite function of the down navigation button and soft key 112 when the information dialog is present. In other words, the up navigation button can be programmed to provide a way to scroll up the information on the display. The left and right navigation buttons can be disabled when the information dialog is present.

Soft key 113 can be programmed to select "Close" 1118, which closes the information dialog once soft key 1111 is pressed. There are various other ways the information dialog can be prompted to close. For instance, the user can close the information dialog by pressing [Info] button 128 while the information dialog is present. The information dialog may also be closed by turning the rotary switch to a new position or pressing the on/off button or a dedicated mode button.

[Info] button 128 can be pressed in any context. Title bar 1106 can reflect the context within which the button as pressed. Examples of contexts can include: Measure Volts DC, Measure Volts AC, Measuring Crest Factor, Measuring Duty Cycle, Recording Measurements, and Choosing a Measurement Function.

The information dialog can include a scrolling memory that remembers where in the information dialog the user last scrolled during a previous viewing of the information dialog in the same context. In other words, once the user has scrolled to a certain position in the information dialog, he may toggle between the underlying screen and the information dialog without losing his place in the information dialog. For instance, if the user presses [Info] button 128 while measuring Volts AC, the information dialog can pop up displaying the first topic listed in the information dialog. Then, if the user scrolls down the information dialog to the fourth listed topic, toggles back to the original screen and subsequently back to the information dialog, the information dialog will display the fourth listed topic.

The overview information displayed when [Info] button 128 is pushed can be available in a variety of languages. The overview information can be stored in compressed format to minimize the storage requirements providing more capacity for storing measurement information.

Referring to FIG. 3, the [Info] button 128 is part of the keys/button input 350 that is electrically connected to Application Processor 322. When a user depresses this key, the Application Processor 322 retrieves information about the context from memory 330 concerning the Info button 336. More specifically, the Application Processor queries the memory for data to provide to the display 300 based upon the context of icons, modes and other information relevant to the present display.

Accordingly, the exemplary embodiment provides integrated capability to dramatically improve the operability of a digital multimeter that incorporates various feature, measurement functions, and modes. By dynamically generating text on the display that corresponds to the present display context, a user can instantly learn about the capabilities of the instrument without having to refer to a separate user manual. The presentation of the requested information is tailored for the small LCD screen provided on the instrument. Because the multimeter is intended to be portable and self-contained, it is otherwise highly inconvenient to separately carry a user manual. Further, experienced technicians or other users may be unlikely to tote a user's manual, but would benefit from gaining instant information concerning the capability of a particular feature associated with an icon on the display. By incorporating this functionality with the soft-buttons, navigational buttons, and other forms of user input, a user can easily navigate the vast glossary of information concerning the device to find the desired information quickly and efficiently.

As another unique aspect of incorporating the Info button on the instrument, a company can re-program or tailor the presentation of information from the Info-button to correspond to particular company procedures or processes associated with measuring electrical circuits. This highly-innovative feature provides a particular, unforeseen benefit in the context of a digital multimeter, since it can be used by a fleet of mobile technicians at remote sites, who need to adhere to guidelines provided by a company. In accordance with an exemplary embodiment, the memory 330 can be easily programmed for customized information through an associated Flash input, USB port, or other interface.

CONCLUSION

Rotary switch memory, mini-measurement display, and Info button glossary access can be integrated into a single multimeter. Alternatively, each can be provided separately, or independently. The user may be able to configure the multimeter to enable or disable rotary switch memory, mini-measurement or the Info button.

Many specific details of certain embodiments of the invention are set forth in the description and in FIGS. 1-11 to provide a thorough understanding of these embodiments. A person skilled in the art, however, will understand that the invention may be practiced without several of these details or additional details can be added to the invention. Well-known structures and functions have not been shown or described in detail to avoid unnecessarily obscuring the description of the embodiments of the invention.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined or altered to provide further embodiments.

These and other changes can be made to the invention in light of the above Detailed Description. While the above description describes certain embodiments of the invention, and describes the best mode contemplated, no matter how detailed the above appears in text, the invention can be practiced in many ways. Details of the system may vary considerably in its implementation details, while still being encompassed by the invention disclosed herein.

The terminology used in the Detailed Description is intended to be interpreted in its broadest reasonable manner, even though it is being used in conjunction with a detailed description of certain specific embodiments of the invention. Certain terms may even be emphasized; however, any terminology intended to be interpreted in any restricted manner will be overtly and specifically defined as such in this Detailed Description section. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

While certain aspects of the invention are presented below in certain claim forms, the inventors contemplate the various aspects of the invention in any number of claim forms. For example, while only one aspect of the invention is recited as a means-plus-function claim under 35 U.S.C sec. 112, other aspects may likewise be embodied as a means-plus-function claim. Accordingly, the inventors reserve the right to add additional claims after filing the application to pursue such additional claim forms for other aspects of the invention.

We claim:

1. A digital multimeter comprising:
   a rotary switch having a plurality of positions corresponding to different default measurement functions to be performed;
   a processor for modifying the default measurement function in at least one of the positions of the rotary switch to have a different measurement setting; and
   a memory for storing the modified measurement setting,
   wherein, the processor is configured such that, when the rotary switch is rotated away from and then back to a position for which the default measurement function has been modified, the processor retrieves the modified measurement setting from the memory and associates the position of the rotary switch with the modified measurement setting in the place of the default measurement function.

2. The digital multimeter of claim 1, wherein the multimeter is configured to continue to store the modified settings in the memory after power to the multimeter is discontinued.

3. The digital multimeter of claim 1, wherein the settings comprise a mode.

4. The digital multimeter of claim 1, wherein the modified measurement setting comprises a measurement function that is different from the default measurement function.

5. The digital multimeter of claim 4, wherein at least one position is associated with a default measurement function and an alternative measurement function, and the setting is changed to toggle to the alternative measurement function.

6. The digital multimeter of claim 1, wherein the processor is configured to be disabled from modifying settings upon receiving user input to return all settings to default measurement functions.

7. A digital multimeter comprising:
- a rotary switch having a plurality of positions wherein, for a plurality of positions on the switch, the position on the switch corresponds to a default measurement function;
- a user interface configured to receive:
  - (1) an alternative measurement function selection, and
  - (2) an enable command;
- a processor configured, in response to an alternative measurement function selection received from the user interface for a certain rotary switch position, to associate the alternative measurement function selection with the rotary switch position in the place of the default measurement function, thereby modifying the measurement setting corresponding to the switch position; and
- a memory for storing the modified measurement setting, wherein, when the rotary switch is rotated away from and back to a rotary switch position for which the measurement setting has been modified, and the processor received from the user interface the enable command, the processor is further configured to retrieve the modified measurement setting from the memory and associate the position of the rotary switch with the alternative measurement function in the place of the default measurement function.

8. The digital multimeter of claim 7, wherein the memory configured to store the modified measurement setting is nonvolatile.

9. The digital multimeter of claim 7, wherein the user interface is further configured to receive a disable command, and wherein, when the rotary switch is rotated back to a position for which the measurement setting has been modified, and the processor received the disable command, the processor associates the position of the rotary switch to the default measurement function.

* * * * *